United States Patent
Kastl et al.

(10) Patent No.: US 8,492,955 B2
(45) Date of Patent: Jul. 23, 2013

(54) PIEZOELECTRIC COMPONENT COMPRISING SECURITY LAYER AND METHOD FOR THE PRODUCTION THEREOF

(75) Inventors: Harald Johannes Kastl, Fichtelberg (DE); Carsten Schuh, Baldham (DE)

(73) Assignee: Siemens Aktiengesellschaft, Munich (DE)

( * ) Notice: Subject to any disclaimer, the term of this patent is extended or adjusted under 35 U.S.C. 154(b) by 502 days.

(21) Appl. No.: 12/593,319

(22) PCT Filed: Mar. 26, 2008

(86) PCT No.: PCT/EP2008/053550
§ 371 (c)(1),
(2), (4) Date: Sep. 28, 2009

(87) PCT Pub. No.: WO2008/119704
PCT Pub. Date: Oct. 9, 2008

(65) Prior Publication Data
US 2010/0026144 A1   Feb. 4, 2010

(30) Foreign Application Priority Data
Mar. 30, 2007   (DE) .................. 10 2007 015 457

(51) Int. Cl.
*H01L 41/083*  (2006.01)
(52) U.S. Cl.
USPC .......................................... 310/328; 310/366
(58) Field of Classification Search
USPC ..................... 310/328, 364–366; 123/472
See application file for complete search history.

(56) References Cited

U.S. PATENT DOCUMENTS

| 6,661,158 | B2 * | 12/2003 | Kawazoe ..................... 310/328 |
| 6,787,975 | B2 * | 9/2004 | Kobayashi et al. .......... 310/366 |
| 6,903,919 | B2 * | 6/2005 | Kayatani et al. ........... 361/321.2 |
| 7,067,960 | B2 * | 6/2006 | Kobayashi et al. .......... 310/328 |
| 7,205,706 | B2 * | 4/2007 | Kadotani et al. ............. 310/365 |
| 7,288,875 | B2 * | 10/2007 | Kadotani et al. ............. 310/328 |

(Continued)

FOREIGN PATENT DOCUMENTS

DE   10327902 A1   6/2004
DE   102004050803 A1   4/2006

(Continued)

OTHER PUBLICATIONS

International Search Report, PCT/EP2008/053550, 10 pages, Jun. 9, 2008.

*Primary Examiner* — J. San Martin
(74) *Attorney, Agent, or Firm* — King & Spalding L.L.P.

(57) ABSTRACT

A piezoelectric component with a monolithic stack has piezoceramic layers and electrode layers arranged alternately one on top of the other, at least one porous security layer arranged in the stack for the formation of a crack if mechanical overload of the stack occurs, at least one outer electrode arranged at a lateral surface section for electric contacting of the electrode layers and a plastic sheath of the stack for protecting the stack, wherein the plastic sheath has silicon. The piezoelectric component is characterized in that a coating of the outer electrode, has silicon-free polymer, is arranged between the outer electrode and the plastic sheath. By coating the plating of the outer electrode, the area of the security layer present directly under the plating is protected from silicon component deposits. The piezoelectric component is used for the control of valves, particularly of injection valves of internal combustion engines.

8 Claims, 1 Drawing Sheet

U.S. PATENT DOCUMENTS

| | | | |
|---|---|---|---|
| 7,358,646 B2 | 4/2008 | Asano et al. | 310/328 |
| 7,358,655 B2 * | 4/2008 | Ragossnig et al. | 310/358 |
| 7,411,336 B2 * | 8/2008 | Iwase et al. | 310/328 |
| 7,420,319 B2 * | 9/2008 | Kastl et al. | 310/363 |
| 7,594,309 B2 * | 9/2009 | Iwase et al. | 29/25.35 |
| 7,791,256 B2 * | 9/2010 | Nakamura | 310/364 |
| 7,902,726 B2 * | 3/2011 | Okamura et al. | 310/328 |
| 7,982,373 B2 * | 7/2011 | Doellgast et al. | 310/366 |
| 8,106,565 B2 * | 1/2012 | Kastl et al. | 310/328 |
| 8,134,825 B2 * | 3/2012 | Otsuka et al. | 361/306.3 |
| 8,378,554 B2 * | 2/2013 | Nakamura et al. | 310/328 |
| 2003/0107301 A1 | 6/2003 | Asano et al. | |
| 2006/0022558 A1 | 2/2006 | Bindig et al. | |
| 2006/0238073 A1 | 10/2006 | Ragossnig et al. | 310/328 |
| 2008/0303385 A1 * | 12/2008 | Okamura et al. | 310/366 |
| 2010/0060110 A1 * | 3/2010 | Inagaki et al. | 310/366 |
| 2010/0327704 A1 * | 12/2010 | Sakamoto et al. | 310/365 |

FOREIGN PATENT DOCUMENTS

| | | |
|---|---|---|
| DE | 102005026717 A1 | 12/2006 |
| EP | 1780813 A1 | 5/2007 |
| JP | 01137686 A * | 5/1989 |
| JP | 2003180090 A | 6/2003 |
| JP | 2006518934 A | 8/2006 |
| WO | WO 2005076378 A1 | 8/2005 |
| WO | WO 2006001334 A1 | 1/2006 |
| WO | WO 2007093921 A2 * | 8/2007 |

\* cited by examiner

PIEZOELECTRIC COMPONENT COMPRISING SECURITY LAYER AND METHOD FOR THE PRODUCTION THEREOF

CROSS-REFERENCE TO RELATED APPLICATIONS

This application is a U.S. National Stage Application of International Application No. PCT/EP2008/053550 filed Mar. 26, 2008, which designates the United States of America, and claims priority to German Application No. 10 2007 015 457.9 filed Mar. 30, 2007, the contents of which are hereby incorporated by reference in their entirety.

TECHNICAL FIELD

The invention relates to a piezoelectric component with a monolithic stack, featuring piezoceramic layers and electrode layers arranged alternately one on top of the other, at least one porous security layer arranged in the stack for forming a crack if a mechanical overload of the stack occurs, at least one outer electrode arranged at a lateral surface section for elastic contacting of the electrode layers and a plastic sheath of the stack to protect the stack, with the plastic sheath comprising silicon. In addition to the component, a method for producing the component is specified.

BACKGROUND

The piezoelectric component is a monolithic multilayer ceramic piezoactuator. In a few embodiments such multilayer actuators feature porous, ceramic or metallic security layers (security structures). The porous security layers function as predetermined breaking points: Mechanical overloading of the stack of the piezoactuator especially results in the formation of cracks (polarization cracks) in these security layers. This means that a location definition and guidance of the polarization cracks occurring during a polarization or during operation is possible. The security layers can be formed from ceramic layers or from electrode layers (internal electrodes) of increased porosity.

For electrical contacting the internal electrodes are routed alternately to lateral sections of the stack surface isolated electrically from each other. Platings (external platings) are attached to these surface sections. The inner electrodes are connected alternately in parallel via these platings, which can be considered as a component of outer electrodes.

The stack of the piezoactuator is provided with a plastic sheath made from silicon. This plastic sheath is used for passivation of the stack. This means: The inner electrodes extending up to the lateral surfaces of the stack are electrically insulated and protected from mechanical destruction by the plastic sheathing.

When the silicon is attached to the surface of the stack there can be infiltration of silicon particles into the porous security layer. As a result of such an infiltration there can be decomposition of the silicon and decomposition products can be deposited especially in the area of the outer plating and directly below it by electrical discharges or mechanical compressive stresses. This can let a mechanical notch effect occur in the crack, which in its turn can lead to damage to the security layer and its environment. This can cause longitudinal cracks along the stacking direction of the stack. The component is thus predisposed to early failure.

SUMMARY

According to various embodiments, the infiltration of silicon into the porous security layer during production of the piezoelectric component with a monolithic stack can be prevented.

According to an embodiment, a piezoelectric component with a monolithic stack may feature—piezoceramic layers and electrode layers arranged alternately one on top of the other,
- at least one porous security layer arranged in the stack to form a crack if mechanical overload of the stack occurs,—at least one outer electrode arranged at a lateral section of the surface for electrical contacting of the electrode layers and
- a plastic sheath of the stack for protection of the stack, with the plastic sheath featuring silicon, wherein—between the outer electrode and the plastic sheath is arranged a coating of the outer electrode with silicon-free polymer.

According to a further embodiment, the outer electrode may feature a plating track and/or a solder track which is covered by the coating. According to a further embodiment, the silicon-free polymer may be at least one plastic selected from the group polyamide, polyester, polyimide, polyetheretherketone and polyurethane.

According to another embodiment, a method for producing a component may have the following method steps: a) Provision of a monolithic stack with electrode layers and piezoceramic layers arranged alternately one on top of the other, at least one porous security layer arranged in the stack for formation of a crack if a mechanical overload of the stack occurs, and an outer electrode arranged at a lateral section of the surface of the stack, b) Arrangement of a coating of silicon-free polymer on the outer electrode and c) Arrangement of the plastic sheath with silicon on the coating.

According to a further embodiment, for arranging the coating, non-cross-linked or part-cross-linked raw material of the polymer is applied to the outer plating using a method from the group consisting of painting, screen printing and injection and subsequently cross-linked.

According to yet another embodiment, a piezoelectric component as described above may be used for controlling a valve and especially an injection valve of an internal combustion engine.

BRIEF DESCRIPTION OF THE DRAWINGS

The invention will be described below in greater detail with reference to an exemplary embodiment and the associated figures. The figures are schematic and do not represent true-to-scale drawings.

DETAILED DESCRIPTION

Figure 1:
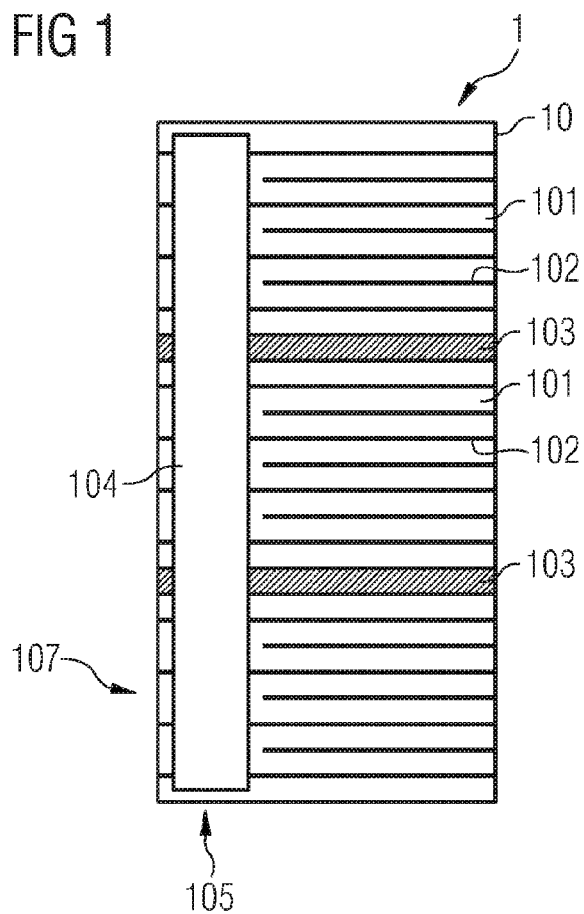
FIG. 1 shows a monolithic stack of a piezoelectric component from the side.

According to various embodiments, a piezoelectric component with a monolithic stack is specified, featuring piezoceramic layers and electrode layers arranged alternately one on top of the other, at least one porous security layer arranged in the stack for formation of a crack if mechanical overload of the stack occurs, at least one outer electrode arranged at a lateral section of the surface for electrical contacting of the electrode layers and a plastic sheath of the stack for protecting the stack, with the plastic sheath featuring silicon. The piezoelectric component is characterized by the fact that a coating of the outer electrode with silicon-free polymer is arranged between the outer electrode and the plastic sheath.

Furthermore, according to another embodiment, a method for producing the component is specified with the following steps: a) Provision of a monolithic stack with electrode layers and piezoceramic layers arranged alternately one on top of the other, at least one porous security layer arranged in the stack for formation of a crack if a mechanical overload of the stack occurs, and an outer electrode arranged at a lateral section of the surface of the stack, b) Arrangement of a coating of silicon-free polymer on the outer electrode and c) Arrangement of the plastic sheath on the coating.

The basic idea according to various embodiments consists of covering the outer electrode with a silicon-free polymer. The covering simultaneously covers the area of a porous security layer located below the outer electrode. The covering functions as an infiltration barrier for the silicon.

Silicon-free in this context means that very small amounts of silicon of below 1 Mol % and especially below 0.1 Mol % are present. A plurality of plastic can be considered as silicon-free polymers. Preferably the silicon-free polymer is at least one plastic selected from the group polyamide (PA), polyester, polyimide (PI), polyetheretherketone (PEEK) and polyurethane (PU). Other suitable materials are for example polyester sulfone (PES), polybutylenterephthalate (PBT), polyethylenterephthalate (PET), polycarbonate (PC) and epoxy resin (EP).

The outer electrode has various components. Thus a baked-on plating (outer plating) is attached to a lateral section of the stack. A wire harp is soldered to this outer plating with the aid of a solder track for example. A hot-bar soldering (thermode soldering) process is employed to do this. After the outer electrode has been fitted a covering is applied to the outer electrode at least in the area in which the outer electrode is attached to the stack (contacting area).

Advantageously a Kapton® tape used during a thermode soldering process to protect a thermode can be used directly as a covering.

After the covering of silicon-free polymer is applied the plastic sheath of silicon can be applied. This is typically done using an injection molding process.

The piezoelectric component described with the monolithic multilayer stack will preferably be used for controlling a valve and especially for controlling an injection valve of an internal combustion engine.

In summary, the various embodiments give the following major advantages:
  With the aid of the covering of silicon-free plastic applied directly to the outer plating infiltration of liquid material into the area of the security layer and directly under the outer plating is delayed during the production process and during operation.
  The infiltration of material is likewise prevented after the polarizing of the stack or after the occurrence of polarization cracks in a security layer of the stack.
  Both lead to undesired mechanical stresses and the initiation of transverse crack in the area of a security layer being avoided. This leads to the functions of the piezoelectric component being maintained, especially with high electrical, mechanical and thermal stresses.

Figure 2:
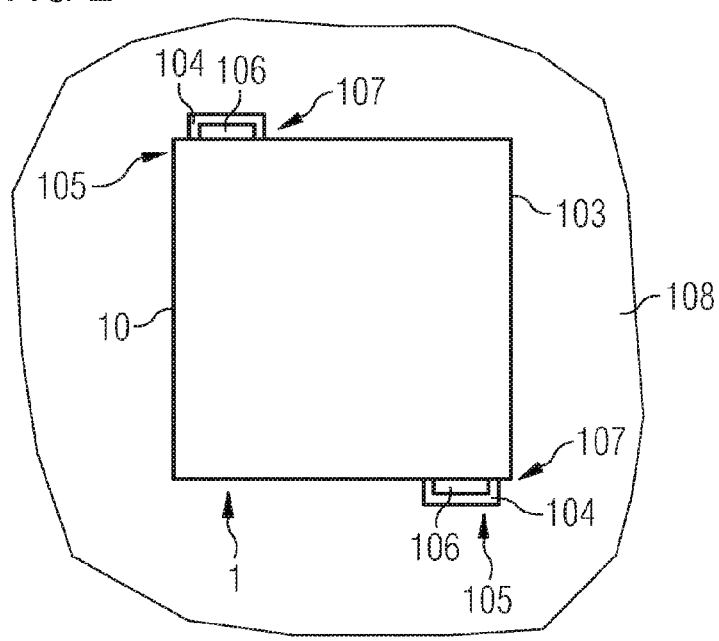
FIG. 2 shows a section through the stack at the height of a security layer.

The piezoelectric component 1 is a monolithic multilayer piezoelectric actuator (FIGS. 1 and 2). The multilayer piezoelectric actuator has a stack 10 made of piezoceramic layers 101 and electrode layers 102 arranged alternately one on top of the other. The piezoceramic layers feature lead zirconate titanate. The electrode layers are formed from a palladium silver alloy. Porous security layers 103 are built into the stack. The stack is able to be divided into part stacks by the security layers.

In accordance with a first embodiment the security layer is of a ceramic nature. In an alternate embodiment the security layer has an increased porosity in relation to the rest of the stack. In both embodiments the security layer has an increased porosity in relation to the rest of the stack.

This leads to the security stack functioning as a predetermined breaking point. Preferably cracks occur in this security layer with increased porosity during mechanical overload of the stack. This makes it possible to control the formation and propagation of the crack.

Platings 106 for electrical contacting of the electrode layers of the stack are arranged at lateral sections of the surface 107 of the stack. Different electrical potentials can be applied alternately via the two platings to the electrode layers. To this end the wire harps shown are soldered to the platings with the aid of a hot-bar soldering method.

Above the platings there is a covering 104 made of a silicon-free polymer. In one version the silicon-free polymer is a polyurethane. In an alternate version the covering is made from polyimide.

The final layer is formed by a silicon sheath 108. Arranged between the outer electrode and the sheath is the covering made of silicon-free polymer.

To produce the piezoelectric component a monolithic stack with piezoceramic layers, electrode layers and porous security layers is first provided. To this end ceramic green films are compressed with metal, stacked one on top of the other to form a green film compound, debindered and sintered into a monolithic stack. The green films lead to the piezoceramic layers. The electrode layers result from the imprinted metal (metal layers). Also integrated in the green foil combination is an output layer of the security layer, from which the security layer is formed during the sintering process.

Subsequently outer electrodes are attached to the lateral surface sections of the stack. Platings are first attached for this purpose. Soldered to the platings, as already explained, are wire harps.

After the wire harps are soldered on, the polymer or cross-linked, silicon-free polymer is applied. This is done by injection molding. After the application the cross-linking of the polymer is initiated in a suitable manner. The covering of silicon-free polymer is formed.

After the production of the covering silicon is applied in an injection molding process and hardened. The silicon functions as a support for the wires of the wire harps. In addition an outer form (contour) of the piezoelectric component is shaped. The outer form is adapted to a use of the component. For example the plastic sheath is used to round off the component.

In an alternate embodiment to this the monolithic stack including outer electrode and covering made of silicon-free polymer is placed into a sleeve and an intermediate space between the sleeve and the stack is injected with silicon.

What is claimed is:
1. A piezoelectric component with a monolithic stack, comprising:
  piezoceramic layers and electrode layers arranged alternately one on top of the other to form a stack,
  at least one porous security layer arranged in the stack to form a crack if mechanical overload of the stack occurs,
  at least one outer electrode having a silicon-free polymer coating arranged at a lateral section of the surface for electrical contacting of the electrode layers and a plastic sheath made of silicon for protection of, arranged around and in contact with the stack,
wherein the silicon-free polymer coating of the outer electrode is arranged between the outer electrode and the plastic sheath.

2. The component according to claim 1, wherein the outer electrode comprises at least one of a plating track and a solder track which is covered by the coating.

3. The component according to claim 1, wherein the silicon-free polymer being at least one plastic selected from the group consisting of: polyamide, polyester, polyimide, polyetheretherketone and polyurethane.

4. A method for producing a component comprising:
a) providing a monolithic stack with electrode layers and piezoceramic layers arranged alternately one on top of the other, at least one porous security layer arranged in the stack for formation of a crack if a mechanical overload of the stack occurs, and with an outer electrode arranged at a lateral section of the surface of the stack,
b) providing the outer electrode with a silicon-free polymer coating, and
providing a plastic sheath made of silicon on the silicon-free polymer coating and around and in contact with the monolithic stack.

5. The method according to claim 4, wherein, for arranging the coating, non-cross-linked or part-cross-linked raw material of the polymer is applied to the outer plating using a method from the group consisting of painting, screen printing and injection and subsequently cross-linked.

6. A method of using a piezoelectric component comprising:
providing a piezoelectric component comprising:
piezoceramic layers and electrode layers arranged alternately one on top of the other to form a stack,
at least one porous security layer arranged in the stack to form a crack if mechanical overload of the stack occurs,
at least one outer electrode arranged at a lateral section of the surface for electrical contacting of the electrode layers, the at least one outer electrode having a silicon-free polymer coating, and
a plastic sheath made of silicon arranged around and in contact with the stack for protection of the stack,
wherein the silicon-free polymer coating of the outer electrode is arranged between the outer electrode and the plastic sheath, and
controlling a valve or an injection valve of an internal combustion engine with said piezoelectric component.

7. The method according to claim 6, wherein the outer electrode comprises at least one of a plating track and a solder track which is covered by the coating.

8. The method according to claim 6, wherein the silicon-tree polymer being at least one plastic selected from the group consisting of: polyamide, polyester, polyimide, polyetheretherketone and polyurethane.

* * * * *